(12) United States Patent
Tan

(10) Patent No.: US 12,320,861 B2
(45) Date of Patent: Jun. 3, 2025

(54) BATTERY STATUS MEASUREMENT METHOD

(71) Applicant: BRYMEN TECHNOLOGY CORPORATION, New Taipei (TW)

(72) Inventor: Po-Chao Tan, New Taipei (TW)

(73) Assignee: BRYMEN TECHNOLOGY CORPORATION, New Taipei (TW)

( * ) Notice: Subject to any disclaimer, the term of this patent is extended or adjusted under 35 U.S.C. 154(b) by 179 days.

(21) Appl. No.: 18/235,340

(22) Filed: Aug. 17, 2023

(65) Prior Publication Data

US 2025/0035710 A1   Jan. 30, 2025

(30) Foreign Application Priority Data

Jul. 25, 2023   (TW) ................................ 112127813

(51) Int. Cl.
| | | |
|---|---|---|
| *G01R 31/392* | (2019.01) | |
| *G01R 31/36* | (2020.01) | |
| *G01R 31/3835* | (2019.01) | |

(52) U.S. Cl.
CPC ....... *G01R 31/392* (2019.01); *G01R 31/3646* (2019.01); *G01R 31/3835* (2019.01)

(58) Field of Classification Search
None
See application file for complete search history.

(56) References Cited

U.S. PATENT DOCUMENTS

| | | | |
|---|---|---|---|
| 10,436,845 B2* | 10/2019 | Weicker | G01R 31/3648 |
| 2015/0102818 A1* | 4/2015 | Rueger | G01R 31/392 |
| | | | 324/427 |
| 2015/0154816 A1* | 6/2015 | Chen | G01R 31/343 |
| | | | 701/29.1 |
| 2018/0229744 A1 | 8/2018 | Manzari et al. | |

FOREIGN PATENT DOCUMENTS

| | | |
|---|---|---|
| CN | 108698522 A | 10/2018 |
| DE | 3901680 A1 | 3/1990 |
| DE | 102004009328 A1 | 1/2005 |
| DE | 102019129902 A1 | 5/2021 |

OTHER PUBLICATIONS

Office Action dated Jun. 13, 2024 of the corresponding Taiwan patent application No. 112127813.
Office Action dated Jul. 9, 2024 of the corresponding German patent application No. 102023124135.4.

* cited by examiner

*Primary Examiner* — Jermele M Hollington
(74) *Attorney, Agent, or Firm* — Chun-Ming Shih; HDLS IPR SERVICES

(57) ABSTRACT

A battery status measurement method includes following steps. A voltage detection circuit (102) is connected to a motor (202) and a battery (204). The battery (204) provides a starting voltage (206) to the motor (202) to start the motor (202). The voltage detection circuit (102) detects the starting voltage (206) to obtain a minimum starting voltage value (208). The voltage detection circuit (102) sends the minimum starting voltage value (208) to a comparing unit (104).

(Continued)

The comparing unit (104) compares the minimum starting voltage value (208) and a starting voltage threshold value (210) to obtain a battery status signal (212). The comparing unit (104) sends the battery status signal (212) to a display (106). The display (106) displays the battery status signal (212).

10 Claims, 3 Drawing Sheets

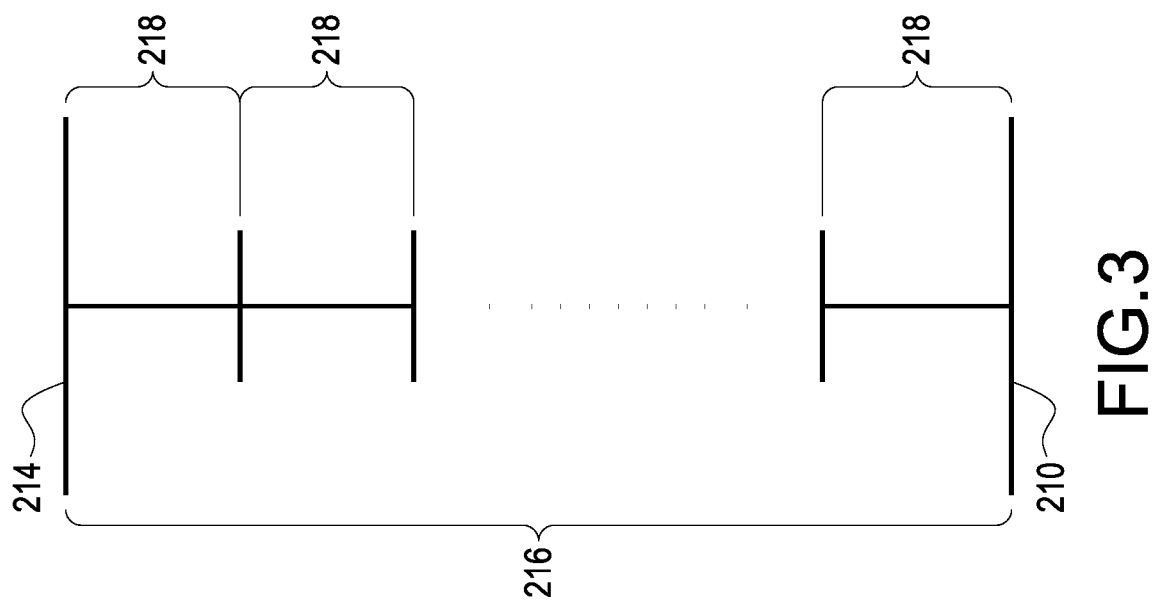

BATTERY STATUS MEASUREMENT METHOD

BACKGROUND OF THE DISCLOSURE

Technical Field

The present disclosure relates to a measurement method, and especially relates to a battery status measurement method.

Description of Related Art

A battery (or a battery jar) of a car is used to start and supply power to an engine-starting motor of the car, so the battery of the car is very important. After long-term use, the internal resistance of the battery of the car will increase, causing the battery of the car to gradually age and affect the ability to start and supply power to the engine-starting motor of the car. Therefore, it is very important to measure the life health status of the battery of the car.

There are many methods for measuring the life health status of the battery of the car at present, but these methods all need to remove the battery of the car from the fixed ends of the power connectors of the engine-starting motor of the car, which is very inconvenient.

Generally speaking, the specifications of the lead-acid battery of the fuel oil car are as follows:
1. Battery voltage: 12 volts or 24 volts.
2. Battery capacity (ampere-hour; AH): The time required to discharge the lead-acid battery at a rated current until the battery voltage is at the lowest rated voltage is the battery capacity (AH).
3. Cold cranking current CCA (cold cranking amps): The maximum cranking current of the lead-acid battery in an environment of −18 degrees Celsius.

A related art battery life measuring instrument is to simulate and control the load current and time, and then inversely estimate the current battery capacity (AH) under test, and then input the battery capacity (AH) of the original battery model specification, and then compare and calculate the decay ratio of the current battery capacity (AH) under test, which is a state of health (SoH) indicator.

The related art battery life measuring instrument mentioned above has the following disadvantages:
1. Battery terminals must be disassembled to test the battery, which is very troublesome; if the battery terminals are not locked back firmly, the car system is prone to problems and causes dangers.
2. The measurement accuracy is not high because it is measured by simulating discharge.

The following two points are the reasons why the related art discharge-type battery life measuring instrument cannot accurately know the difference between the capacity (AH) of the current battery under test and the capacity (AH) of the original new battery:
1. Because the simulated starting current is very different from the original factory specification condition CCA.
2. Because the battery storage capacity (AH) of the lead-acid battery will be affected by the ambient temperature.

SUMMARY OF THE DISCLOSURE

In order to solve the above-mentioned problems, an object of the present disclosure is to provide a battery status measurement method.

In order to achieve the object of the present disclosure mentioned above, the battery status measurement method of the present disclosure is applied to a digital measuring instrument and a load apparatus. The digital measuring instrument includes a voltage detection circuit, a comparing unit, and a display. The load apparatus includes a motor and a battery. The battery status measurement method includes following steps. The voltage detection circuit of the digital measuring instrument is connected to the motor of the load apparatus and the battery of the load apparatus. The battery of the load apparatus provides a starting voltage to the motor of the load apparatus to start the motor of the load apparatus. The voltage detection circuit of the digital measuring instrument detects the starting voltage to obtain a minimum starting voltage value. The voltage detection circuit of the digital measuring instrument sends the minimum starting voltage value to the comparing unit of the digital measuring instrument. The comparing unit of the digital measuring instrument compares the minimum starting voltage value and a starting voltage threshold value to obtain a battery status signal. The comparing unit of the digital measuring instrument sends the battery status signal to the display of the digital measuring instrument. The display of the digital measuring instrument displays the battery status signal.

Moreover, in an embodiment of the battery status measurement method of the present disclosure mentioned above, the battery status measurement method further includes the following step. The comparing unit of the digital measuring instrument sends the minimum starting voltage value to the display of the digital measuring instrument.

Moreover, in an embodiment of the battery status measurement method of the present disclosure mentioned above, the battery status measurement method further includes the following step. The display of the digital measuring instrument displays the battery status signal and the minimum starting voltage value simultaneously.

Moreover, in an embodiment of the battery status measurement method of the present disclosure mentioned above, the battery status measurement method further includes the following step. The display of the digital measuring instrument displays the battery status signal and the minimum starting voltage value alternately.

Moreover, in an embodiment of the battery status measurement method of the present disclosure mentioned above, the minimum starting voltage value is greater than or equal to the starting voltage threshold value; the battery status signal is a normal signal representing that the battery of the load apparatus is normal.

Moreover, in an embodiment of the battery status measurement method of the present disclosure mentioned above, the minimum starting voltage value is less than the starting voltage threshold value; the battery status signal is an abnormal signal representing that the battery of the load apparatus is abnormal.

Moreover, in an embodiment of the battery status measurement method of the present disclosure mentioned above, the load apparatus is a car using a 12-volt system; the starting voltage threshold value is 6 volts.

Moreover, in an embodiment of the battery status measurement method of the present disclosure mentioned above, the load apparatus is a car using a 24-volt system; the starting voltage threshold value is 10 volts.

Moreover, in an embodiment of the battery status measurement method of the present disclosure mentioned above, the digital measuring instrument is a hand-held digital measuring instrument. The comparing unit is a microprocessor or a comparator circuit.

Moreover, in an embodiment of the battery status measurement method of the present disclosure mentioned above, the battery of the load apparatus is fully charged to be detected by the voltage detection circuit of the digital measuring instrument.

The advantage of the present disclosure is to simply measure life health status of the battery of the load apparatus.

Please refer to the detailed descriptions and figures of the present disclosure mentioned below for further understanding the technology, method and effect of the present disclosure achieving the predetermined purposes. It believes that the purposes, characteristic and features of the present disclosure can be understood deeply and specifically. However, the figures are only for references and descriptions, but the present disclosure is not limited by the figures.

BRIEF DESCRIPTION OF THE DRAWINGS

FIG. 3 shows a schematic diagram of a voltage range of the present disclosure.

DETAILED DESCRIPTION

Figure 1:
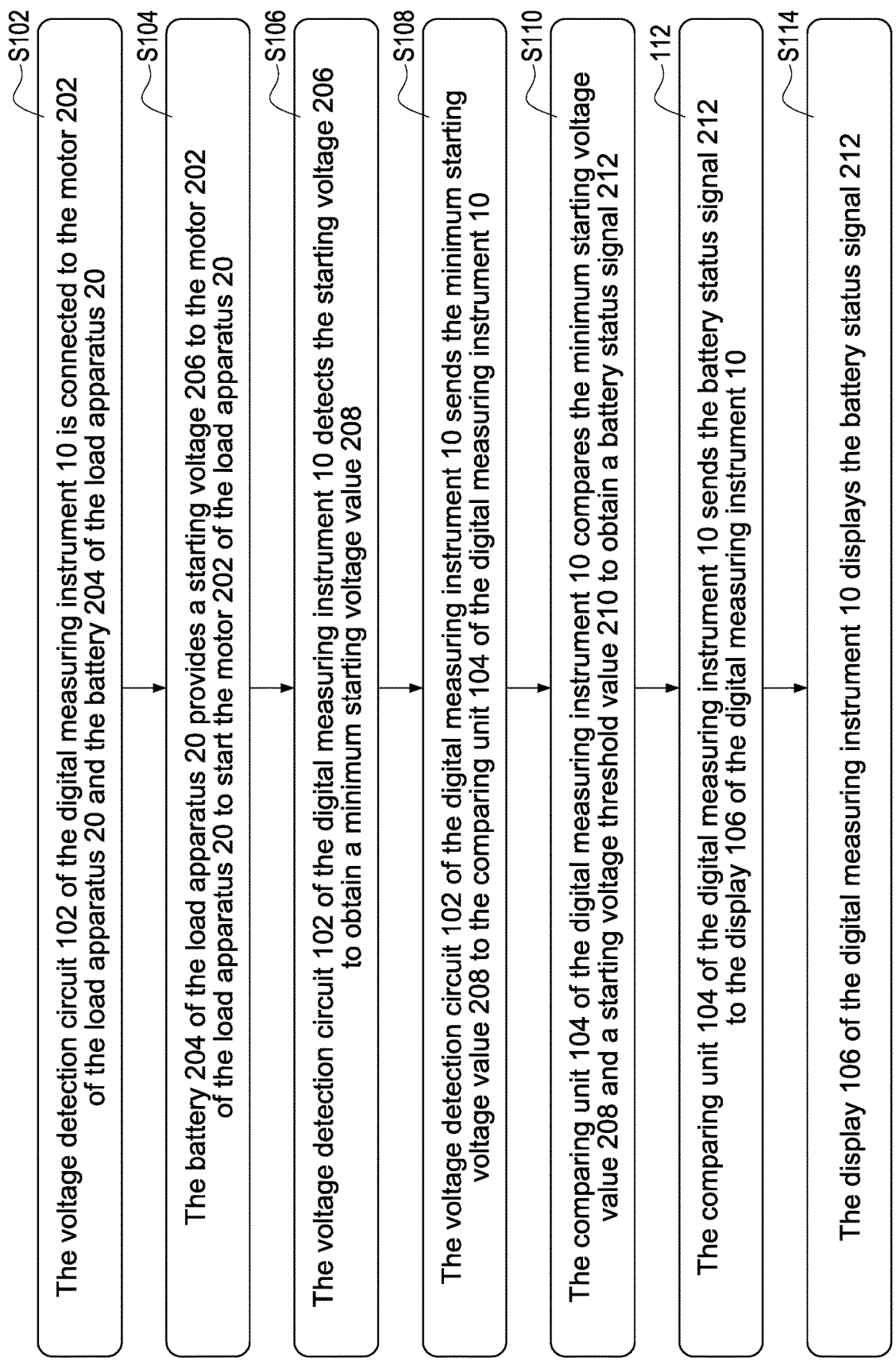
FIG. 1 shows a flow chart of an embodiment of the battery status measurement method of the present disclosure.

In the present disclosure, numerous specific details are provided, to provide a thorough understanding of embodiments of the disclosure. Persons of ordinary skill in the art will recognize, however, that the present disclosure can be practiced without one or more of the specific details. In other instances, well-known details are not shown or described to avoid obscuring aspects of the present disclosure. Now please refer to the figures for the explanation of the technical content and the detailed description of the present disclosure:

First, the following content describes the origin and concept of the present disclosure:

An important specification of a battery of a car is that: when a motor (or an engine) of the car is at a maximum starting current, how much power the battery of the car can output instantly. Instantaneous starting power $P_{start} = I_{start} * V_{start}$, where $I_{start}$ is the starting current (namely, cranking amps, referred to as CA), and $V_{start}$ is the engine starting voltage; when the battery ages, the internal resistance of the battery will increase and the ability of the battery storing energy will decrease (under the condition that the battery is fully charged). When the engine of the same car is started, $I_{start}$ current is mostly similar; therefore, when the motor of the car is started, the stored energy of the aging battery is reduced due to the reduction of the starting voltage of the engine (due to the aging of the battery); namely, the instantaneous starting output power of the battery will decrease due to the increment of the internal resistance of the battery aging. Also, because the battery starting voltage is too low, the car engine motor and electrical control system cannot be started smoothly.

According to the standard specification of ISO 16750-2 Part 2 Electrical loads Clause 4.6.3 Starting profile, the electrical load of the car must adapt to and pass a simulated car battery voltage waveform (which has a minimum voltage) test; if the car uses the 12-volt system, this minimum voltage is 6 volts; if the car uses the 24-volt system, this minimum voltage is 10 volts. Namely, when the motor of the car is started (at the moment of starting, the voltage of the battery of the car will drop suddenly), if the dropping voltage of the battery of the car is lower than the minimum voltage, the electrical load of the car will not work normally. Namely, the present disclosure determines whether the battery is qualified/normal or not by the minimum voltage and the sudden dropping voltage of the battery.

Thus, the present disclosure does not have to remove the battery of the car from the motor of the car; when the motor of the car is started (at the moment of starting, the voltage of the battery of the car will drop suddenly), the present disclosure directly measures whether the lowest value of the dropping voltage of the battery of the car can be greater than or equal to the above-mentioned minimum voltage, to determine whether the battery is qualified/normal.

Next, the following content describes the details of the present disclosure:

FIG. 1 shows a flow chart of an embodiment of the battery status measurement method of the present disclosure. Please refer to FIG. 2 at the same time, which shows a block diagram of an embodiment applied to the battery status measurement method of the present disclosure. The battery status measurement method of the present disclosure is applied to a digital measuring instrument 10 and a load apparatus 20. The digital measuring instrument 10 is, for example but not limited to, a hand-held digital measuring instrument, a portable digital measuring instrument or a mobile digital measuring instrument. The load apparatus 20 is, for example but not limited to, a car.

Figure 2:
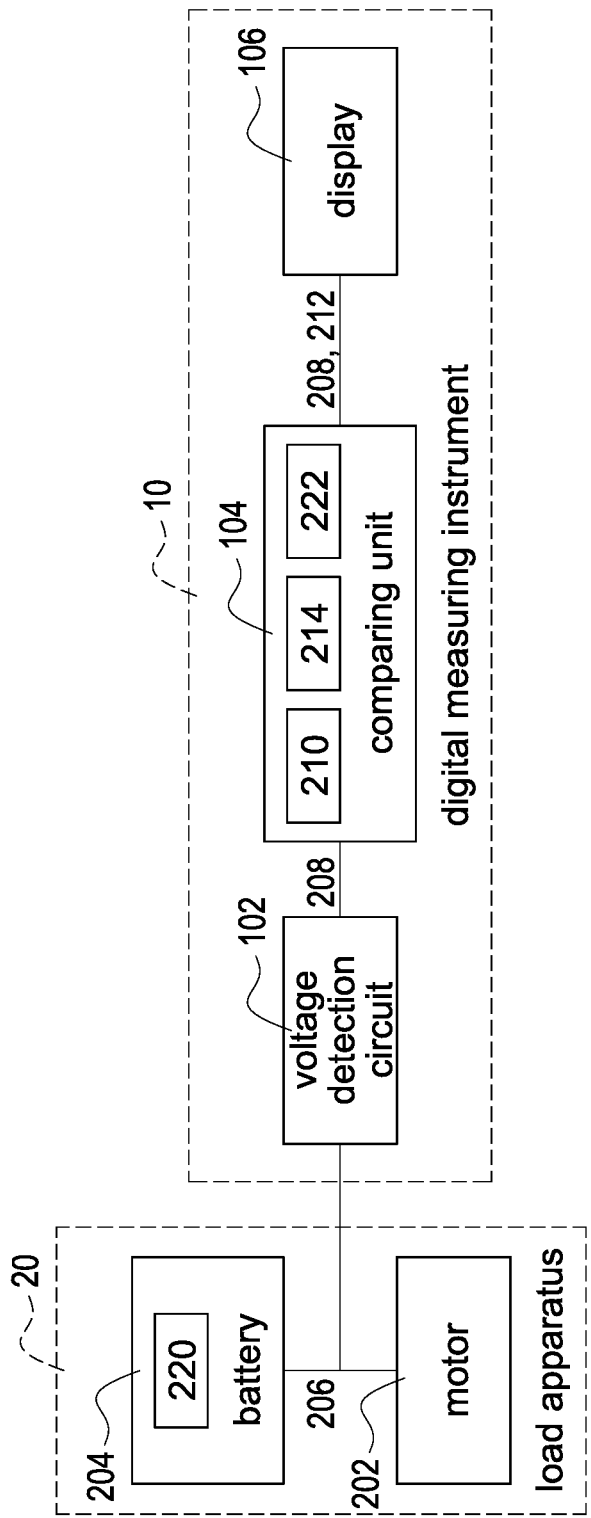
FIG. 2 shows a block diagram of an embodiment applied to the battery status measurement method of the present disclosure.

The digital measuring instrument 10 includes a voltage detection circuit 102, a comparing unit 104, a display 106 and an analog-to-digital converter (not shown in FIG. 2). The load apparatus 20 includes a motor 202 and a battery 204. The motor 202 may also be called "engine-starting motor" or "load-starting motor". The battery 204 is, for example but not limited to, a lead-acid battery or a battery jar. The comparing unit 104 is, for example but not limited to, a microprocessor or a comparator circuit.

The battery status measurement method includes following steps:

Step S102: The voltage detection circuit 102 of the digital measuring instrument 10 is connected to the motor 202 of the load apparatus 20 and the battery 204 of the load apparatus 20. Then, the battery status measurement method goes to step S104 and step S106. In more details, the voltage detection circuit 102 of the digital measuring instrument 10 includes a positive terminal testing rod (not shown in FIG. 2) and a negative terminal testing rod (not shown in FIG. 2). The battery 204 of the load apparatus 20 includes a positive terminal (not shown in FIG. 2) and a negative terminal (not shown in FIG. 2). The positive terminal testing rod of the voltage detection circuit 102 is connected to the positive terminal of the battery 204. The negative terminal testing rod of the voltage detection circuit 102 is connected to the negative terminal of the battery 204. The positive terminal and the negative terminal of the battery 204 are also connected to the motor 202 of the load apparatus 20 to supply power to the motor 202.

Step S104: The battery 204 of the load apparatus 20 provides a starting voltage 206 to the motor 202 of the load apparatus 20 to start the motor 202 of the load apparatus 20, and at the same time, the battery status measurement method also performs step S106.

Step S106: The voltage detection circuit 102 of the digital measuring instrument 10 detects the starting voltage 206 to obtain a minimum starting voltage value 208. Then, the battery status measurement method goes to step S108.

In more details, before the battery status measurement method performs step S104 and step S106, the battery 204 of the load apparatus 20 is fully charged to be detected by the voltage detection circuit 102 of the digital measuring instrument 10. When the load apparatus 20 is to be used, the load apparatus 20 is remotely started or started by a key from the static state, so that the battery 204 of the load apparatus 20 provides the starting voltage 206 to the motor 202 of the load apparatus 20 to start the motor 202 of the load apparatus 20; the action of starting the motor 202 of the load apparatus 20 will cause the voltage of the battery 204 of the load apparatus 20 to drop suddenly and then pull up; the minimum value of the dropping voltage is the minimum starting voltage value 208. The digital measuring instrument 10 can continuously detect the voltage within a period of time to indicate/record the lowest value of the voltage within the period of time.

Step S108: The voltage detection circuit 102 of the digital measuring instrument 10 sends the minimum starting voltage value 208 to the comparing unit 104 of the digital measuring instrument 10. Then, the battery status measurement method goes to step S110.

Step S110: The comparing unit 104 of the digital measuring instrument 10 compares the minimum starting voltage value 208 and a starting voltage threshold value 210 to obtain a battery status signal 212. Then, the battery status measurement method goes to step S112. In more details, the comparing unit 104 pre-stores the starting voltage threshold value 210, or a memory which is not shown in FIG. 2 pre-stores the starting voltage threshold value 210 and sends the starting voltage threshold value 210 to the comparing unit 104. If the load apparatus 20 is the car using the 12-volt system, the starting voltage threshold value 210 is 6 volts. If the load apparatus 20 is the car using the 24-volt system, the starting voltage threshold value 210 is 10 volts. If the minimum starting voltage value 208 is greater than or equal to the starting voltage threshold value 210, the battery status signal 212 is a normal signal representing that the battery 204 of the load apparatus 20 is normal. If the minimum starting voltage value 208 is less than the starting voltage threshold value 210, the battery status signal 212 is an abnormal signal representing that the battery 204 of the load apparatus 20 is abnormal.

Step S112: The comparing unit 104 of the digital measuring instrument 10 sends the battery status signal 212 to the display 106 of the digital measuring instrument 10. Then, the battery status measurement method goes to step S114.

Step S114: The display 106 of the digital measuring instrument 10 displays the battery status signal 212.

Between step S112 and step S114, the comparing unit 104 of the digital measuring instrument 10 can also send the minimum starting voltage value 208 to the display 106 of the digital measuring instrument 10, so that in step S114, the display 106 of the digital measuring instrument 10 displays the battery status signal 212 and the minimum starting voltage value 208 simultaneously, or the display 106 of the digital measuring instrument 10 displays the battery status signal 212 and the minimum starting voltage value 208 alternately.

Moreover, FIG. 3 shows a schematic diagram of a voltage range of the present disclosure. Please refer to FIG. 2 at the same time. The comparing unit 104 of the digital measuring instrument 10 also stores a first voltage value 214 (or, the memory stores the first voltage value 214 and sends the first voltage value 214 to the comparing unit 104); the first voltage value 214 is greater than the starting voltage threshold value 210; the comparing unit 104 of the digital measuring instrument 10 divides a voltage range 216 between the first voltage value 214 and the starting voltage threshold value 210 into a plurality of voltage subranges 218; the comparing unit 104 of the digital measuring instrument 10 determines which of the voltage subranges 218 the minimum starting voltage value 208 is in, and generates the battery status signal 212 accordingly.

For example, the first voltage value 214 is 14 volts, the starting voltage threshold value 210 is 6 volts, and the voltage range 216 includes three voltage subranges 218, which are 14~10 volts, 10~8 volts and 8~6 volts; if the minimum starting voltage value 208 is 12 volts (in 14~10 volts), the battery status signal 212 is displayed as "excellent"; if the minimum starting voltage value 208 is 9 volts (in 10~8 volts), the battery status signal 212 is displayed as "good"; if the minimum starting voltage value 208 is 7 volts (in 8~6 volts), the battery status signal 212 is displayed as "attention"; if the minimum starting voltage value 208 is 5 volts (less than 6 volts), the battery status signal 212 is displayed as "abnormal" or "bad".

Moreover, before the battery 204 of the load apparatus 20 provides the starting voltage 206 to the motor 202 of the load apparatus 20 to start the motor 202 of the load apparatus 20, the voltage detection circuit 102 of the digital measuring instrument 10 detects a battery voltage 220 of the battery 204 of the load apparatus 20 and informs the comparing unit 104 of the digital measuring instrument 10 of the battery voltage 220, so that the comparing unit 104 of the digital measuring instrument 10 determines the starting voltage threshold value 210 based on the battery voltage 220.

For example, before the battery 204 of the load apparatus 20 provides the starting voltage 206 to the motor 202 of the load apparatus 20 to start the motor 202 of the load apparatus 20, the voltage detection circuit 102 of the digital measuring instrument 10 detects that the battery voltage 220 of the battery 204 of the load apparatus 20 is 12 volts, and informs the comparing unit 104 of the digital measuring instrument 10 that the battery voltage 220 is 12 volts, so that the comparing unit 104 of the digital measuring instrument 10 determines that the starting voltage threshold value 210 is 6 volts based on the battery voltage 220.

Moreover, before the battery 204 of the load apparatus 20 provides the starting voltage 206 to the motor 202 of the load apparatus 20 to start the motor 202 of the load apparatus 20, the voltage detection circuit 102 of the digital measuring instrument 10 detects the battery voltage 220 of the battery 204 of the load apparatus 20 and informs the comparing unit 104 of the digital measuring instrument 10 of the battery voltage 220, so that if the battery voltage 220 is less than a charging threshold value 222 (which is pre-stored in the comparing unit 104 of the digital measuring instrument 10; or the memory stores the charging threshold value 222 and sends the charging threshold value 222 to the comparing unit 104), the comparing unit 104 of the digital measuring instrument 10 controls the display 106 of the digital measuring instrument 10 to display that the battery 204 of the load apparatus 20 needs to be charged. Therefore, the battery 204 of the load apparatus 20 is fully charged to be detected by the voltage detection circuit 102 of the digital measuring instrument 10.

Moreover, please refer to FIG. 2 again. The present disclosure also provides a digital measuring instrument 10 which is applied to a load apparatus 20. The load apparatus 20 includes a motor 202 and a battery 204. The digital measuring instrument 10 includes a voltage detection circuit 102, a comparing unit 104 and a display 106. The voltage detection circuit 102 is connected to the motor 202 and the battery 204. The comparing unit 104 is electrically connected to the voltage detection circuit 102. The display 106 is electrically connected to the comparing unit 104. The rest of the content of the digital measuring instrument 10 of the present disclosure is the same as the content of the battery status measurement method of the present disclosure mentioned above, for the sake of brevity, so the description thereof will not be repeated here.

Compared with the related art battery life health status measurement method, the present disclosure includes the following advantages:
1. There is no need to disassemble the battery terminals; the digital measuring instrument can be directly used for measurement.
2. The testing condition is the health status of the available battery being used by the car under test, and its advantages are as follows:
    a. The cranking current (CA) is based on the car under test as the starting condition, not simulated.
    b. The ambient temperature is based on the health status of the car under test at that time; if the car and the battery are tested in a cold zone, it is also confirmed whether the car can be started healthily at the low temperature with a cold cranking current (CCA).
    c. The detection speed is fast; as long as the engine of the car under test is started, the health result of the battery can be known immediately.

The specifications of the battery can refer to the following website, so it will not be repeated here:
http://www.yuasa.com.tw/product-detail.php?lang=&nId=18

The features of the battery can refer to the following website, so it will not be repeated here:
http://www.yuasa.com.tw/service_and_knowledge03.php?lang=

The advantage of the present disclosure is to simply measure life health status of the battery 204 of the load apparatus 20.

Although the present disclosure has been described with reference to the embodiment thereof, it will be understood that the disclosure is not limited to the details thereof. Various substitutions and modifications have been suggested in the foregoing description, and others will occur to those of ordinary skill in the art. Therefore, all such substitutions and modifications are intended to be embraced within the scope of the disclosure as defined in the appended claims.

What is claimed is:

1. A battery status measurement method applied to a digital measuring instrument (10) and a load apparatus (20), the digital measuring instrument (10) comprising a voltage detection circuit (102), a comparing unit (104) and a display (106), the load apparatus (20) comprising a motor (202) and a battery (204), the battery status measurement method comprising:
    connecting to the motor (202) of the load apparatus (20) and the battery (204) of the load apparatus (20) by the voltage detection circuit (102) of the digital measuring instrument (10) (S102);
    providing a starting voltage (206) to the motor (202) of the load apparatus (20) to start the motor (202) of the load apparatus (20) by the battery (204) of the load apparatus (20) (S104);
    detecting the starting voltage (206) to obtain a minimum starting voltage value (208) by the voltage detection circuit (102) of the digital measuring instrument (10) (S106);
    sending the minimum starting voltage value (208) to the comparing unit (104) of the digital measuring instrument (10) by the voltage detection circuit (102) of the digital measuring instrument (10) (S108);
    comparing the minimum starting voltage value (208) and a starting voltage threshold value (210) to obtain a battery status signal (212) by the comparing unit (104) of the digital measuring instrument (10) (S110);
    sending the battery status signal (212) to the display (106) of the digital measuring instrument (10) by the comparing unit (104) of the digital measuring instrument (10) (S112); and
    displaying the battery status signal (212) by the display (106) of the digital measuring instrument (10) (S114).

2. The battery status measurement method of claim 1, further comprising:
    sending the minimum starting voltage value (208) to the display (106) of the digital measuring instrument (10) by the comparing unit (104) of the digital measuring instrument (10).

3. The battery status measurement method of claim 2, further comprising:
    displaying the battery status signal (212) and the minimum starting voltage value (208) simultaneously by the display (106) of the digital measuring instrument (10).

4. The battery status measurement method of claim 2, further comprising:
    displaying the battery status signal (212) and the minimum starting voltage value (208) alternately by the display (106) of the digital measuring instrument (10).

5. The battery status measurement method of claim 2, wherein the minimum starting voltage value (208) is greater than or equal to the starting voltage threshold value (210); the battery status signal (212) is a normal signal representing that the battery (204) of the load apparatus (20) is normal.

6. The battery status measurement method of claim 2, wherein the minimum starting voltage value (208) is less than the starting voltage threshold value (210); the battery status signal (212) is an abnormal signal representing that the battery (204) of the load apparatus (20) is abnormal.

7. The battery status measurement method of claim 2, wherein the load apparatus (20) is a car using a 12-volt system; the starting voltage threshold value (210) is 6 volts.

8. The battery status measurement method of claim 2, wherein the load apparatus (20) is a car using a 24-volt system; the starting voltage threshold value (210) is 10 volts.

9. The battery status measurement method of claim 2, wherein the digital measuring instrument (10) is a hand-held digital measuring instrument; the comparing unit (104) is a microprocessor or a comparator circuit.

10. The battery status measurement method of claim 2, wherein the battery (204) of the load apparatus (20) is fully charged to be detected by the voltage detection circuit (102) of the digital measuring instrument (10).

* * * * *